US012725759B2

(12) United States Patent
Rosslee et al.

(10) Patent No.: US 12,725,759 B2
(45) Date of Patent: Sep. 1, 2026

(54) WINDOW EDGE HEATER FOR HIGH POWER PLASMA PROCESSING APPLICATIONS

(71) Applicant: Lam Research Corporation, Fremont, CA (US)

(72) Inventors: Craig Rosslee, San Jose, CA (US); Ambarish Chhatre, Danville, CA (US); Dan Marohl, San Jose, CA (US); David Setton, Danville, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 44 days.

(21) Appl. No.: 18/862,126

(22) PCT Filed: May 5, 2023

(86) PCT No.: PCT/US2023/021219
§ 371 (c)(1),
(2) Date: Oct. 31, 2024

(87) PCT Pub. No.: WO2023/219905
PCT Pub. Date: Nov. 16, 2023

(65) Prior Publication Data

US 2025/0349511 A1 Nov. 13, 2025

Related U.S. Application Data

(60) Provisional application No. 63/340,912, filed on May 11, 2022.

(51) Int. Cl.
*H01J 37/32* (2006.01)

(52) U.S. Cl.
CPC ... *H01J 37/32119* (2013.01); *H01J 37/32522* (2013.01); *H01J 2237/332* (2013.01); *H01J 2237/334* (2013.01)

(58) Field of Classification Search
CPC .......... H01J 37/32119; H01J 37/32522; H01J 2237/332; H01J 2237/334; H01J 37/32458; H01J 37/32513
See application file for complete search history.

(56) References Cited

U.S. PATENT DOCUMENTS

| | | | |
|---|---|---|---|
| 2012/0090784 | A1 | 4/2012 | Ouye et al. |
| 2017/0103875 | A1 | 4/2017 | McChesney et al. |

(Continued)

FOREIGN PATENT DOCUMENTS

| | | | |
|---|---|---|---|
| CN | 101656194 | A | 2/2010 |
| CN | 103794457 | B | 8/2016 |

(Continued)

OTHER PUBLICATIONS

PCT Application No. PCT/US2023/021219, International Search Report and Written Opinion of the International Searching Authority, Mailed on Aug. 30, 2023, 11 pages.

(Continued)

*Primary Examiner* — Minh Tran
(74) *Attorney, Agent, or Firm* — Alleman Hall LLP

(57) ABSTRACT

A window support system for a plasma processing chamber includes a window support frame configured to circumscribe an opening. The window support frame has a top surface, a bottom surface, an inner surface, and an outer surface. Each of the inner surface and outer surface extends between the top surface and the bottom surface. A channel is formed within the outer surface. The top surface is configured to mechanically and thermally interface with an outer peripheral portion of a window that is substantially transparent to radiofrequency power. The window support system also includes a heating element disposed within the channel of (Continued)

the window support frame. The heating element is configured to substantially circumscribe the window support frame.

16 Claims, 5 Drawing Sheets

(56) References Cited

U.S. PATENT DOCUMENTS

| | | | | |
|---|---|---|---|---|
| 2017/0358475 | A1* | 12/2017 | Kwon | H01J 37/321 |
| 2019/0051495 | A1* | 2/2019 | Liang | C23C 16/511 |
| 2020/0027705 | A1* | 1/2020 | Kim | H01J 37/32697 |
| 2020/0105508 | A1* | 4/2020 | Belau | H01J 37/32091 |
| 2020/0118894 | A1 | 4/2020 | Shriner et al. | |
| 2021/0305017 | A1 | 9/2021 | Peng et al. | |

FOREIGN PATENT DOCUMENTS

| | | | |
|---|---|---|---|
| KR | 1020120090647 | A | 8/2012 |
| KR | 101208567 | B1 | 12/2012 |
| KR | 101909473 | B1 | 10/2018 |
| KR | 102093559 | B1 | 3/2020 |
| WO | 2021154590 | A1 | 8/2021 |

OTHER PUBLICATIONS

European Patent Office, Extended European Search Report Issued in Application No. 23804048.9, Apr. 23, 2026, Germany, 11 pages.

* cited by examiner (View B-B)

WINDOW EDGE HEATER FOR HIGH POWER PLASMA PROCESSING APPLICATIONS

This application is a national stage filing of and claims priority, under 35 U.S.C. § 371, to PCT/US2023/021219, filed on May 5, 2023, which claims the benefit of U.S. Provisional Application No. 63/340,912, filed on May 11, 2022. The entire disclosure of each application referenced above is incorporated herein by reference.

BACKGROUND

Plasma processing systems are used to manufacture semiconductor devices, e.g., chips/die, on semiconductor wafers. In the plasma processing system, the semiconductor wafer is exposed to various types of plasma to cause prescribed changes to a condition of the semiconductor wafer, such as through material deposition and/or material removal and/or material implantation and/or material modification, etc. During plasma processing of the semiconductor wafer, radiofrequency (RF) power is transmitted through a process gas within a chamber to transform the process gas into the plasma in exposure to the semiconductor wafer. Reactive constituents of the plasma, such as radicals and ions, interact with materials on the semiconductor wafer to achieve a prescribed effect on the semiconductor wafer. In some plasma processing systems, RF power is transmitted from an antenna or coil through a window, e.g., an RF transparent ceramic structure, to the processing region within the chamber in order to transform the process gas into the plasma in exposure to the semiconductor wafer.

In some plasma processing applications, sufficiently high RF power is transmitted into the chamber from the antenna/coil in combination with a sufficiently high pressure within the chamber to cause an adversely large center-to-edge temperature gradient across the window that leads to mechanical failure of the window, e.g., cracking and/or breaking. For example, plasma processing operations at high power, e.g., greater than about 2.5 kiloWatts antenna/coil power, creates large temperature gradients within the window due to high plasma temperature on the chamber-side of the window, heat loss from the edge and top side (non-chamber-side) of the window, and heat loss from the edge of the window to the chamber body. The large center-to-edge temperature gradients across the window create stress in the brittle ceramic material of the window, which leads to catastrophic failure of the window. Also, larger windows, such as for 300 millimeter substrate processing applications, will have larger temperature gradients and correspondingly increased stress. Additionally, large temperature gradients across the window can lead to on-wafer non-uniformities, e.g., similar to the so-called first wafer effect. It is within this context that various embodiments described herein arise.

SUMMARY

In an example embodiment, a window support system for a plasma processing chamber is disclosed. The window support system includes a window support frame configured to circumscribe an opening. The window support frame has a top surface, a bottom surface, an inner surface, and an outer surface. Each of the inner surface and outer surface extends between the top surface and the bottom surface. A channel is formed within the outer surface. The top surface is configured to mechanically and thermally interface with an outer peripheral portion of a window that is substantially transparent to radiofrequency power. The window support system also includes a heating element disposed within the channel. The heating element is configured to substantially circumscribe the window support frame.

In an example embodiment, a plasma processing system is disclosed. The plasma processing system includes a chamber that has a wall that surrounds a plasma processing region. The plasma processing system also includes an adapter structure configured to interface with a top of the wall of the chamber. The adapter structure is configured to circumscribe a first opening. The adapter structure has a flange portion that circumscribes the first opening and projects into the first opening. The plasma processing system also includes a thermal insulator member disposed on the flange portion of the adapter structure. The thermal insulator member is formed as a continuous circuitous structure. The plasma processing system also includes a window support frame disposed on the thermal insulator member. The window support frame is configured to circumscribe a second opening. The window support frame has a top surface, a bottom surface, an inner surface, and an outer surface. Each of the inner surface and outer surface extends between the top surface and the bottom surface. The window support frame includes a channel formed within the outer surface. The plasma processing system also includes a heating element disposed within the channel of the window support frame. The heating element is configured to substantially circumscribe the window support frame. The plasma processing system also includes a window disposed on the window support frame, such that a circuitous outer peripheral portion of the window is in thermal contact with the window support frame. The window is substantially transparent to radiofrequency power.

In an example embodiment, a method is disclosed for controlling temperature of a window of a plasma processing chamber. The method includes supplying heat to a circuitous outer peripheral portion of a window by operating a heating element that emits heat into a window support frame on which the circuitous outer peripheral portion of the window is disposed. The method also includes monitoring a temperature of the circuitous outer peripheral portion of the window. The method also includes adjusting the supplied heat based on the monitored temperature to achieve and maintain a setpoint temperature on the circuitous outer peripheral portion of the window.

Other aspects and advantages of the embodiments disclosed herein will become more apparent from the following detailed description and the accompanying drawings.

DETAILED DESCRIPTION

In the following description, numerous specific details are set forth in order to provide a thorough understanding of the present disclosure. It will be apparent, however, to one skilled in the art that embodiments of the present disclosure may be practiced without some or all of these specific details. In other instances, well known process operations have not been described in detail in order not to unnecessarily obscure the present disclosure.

Systems and methods are disclosed herein for provision and use of a heated structure on which a TCP (transformer-coupled-plasma) window sits to reduce a center-to-edge temperature gradient across the TCP window when performing plasma processing operations at high power and high pressure. For ease of description, the TCP window that separates an antenna/coil from a plasma processing region within a plasma processing chamber is referred to herein as the window. Heating the bottom outer peripheral edge region of the window reduces or eliminates heat loss to the chamber body and raises the window outer peripheral edge region temperature to reduce the center-to-edge temperature gradient across the window and corresponding reduce stress buildup within the window. Also, by heating the outer peripheral edge region of the window, the first wafer effect is reduced, where the first wafer effect refers to differences in process results on a substrate due to the window having a cooler temperature during processing of the first substrate as compared to during processing of subsequent substrates.

Figure 1A:
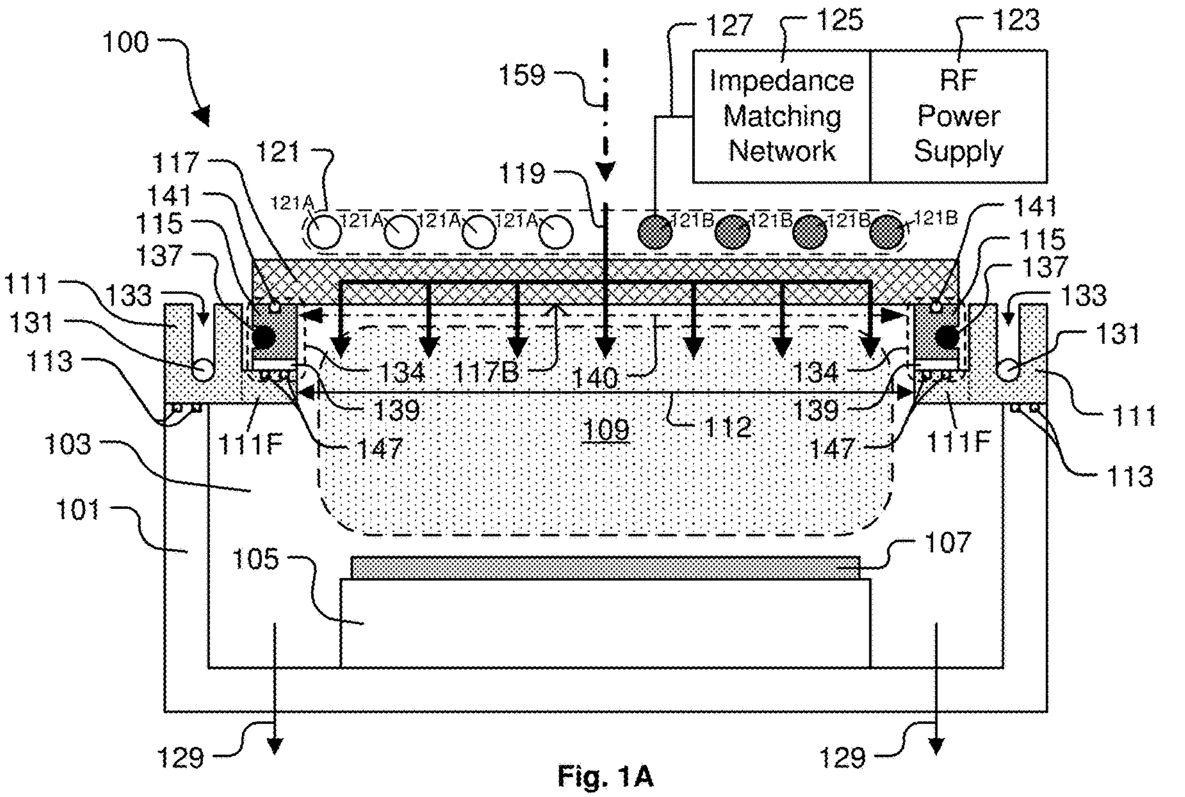
FIG. 1A shows a vertical cross-section view through a portion of an example substrate plasma processing system, in accordance with some embodiments.
Figure 1B:
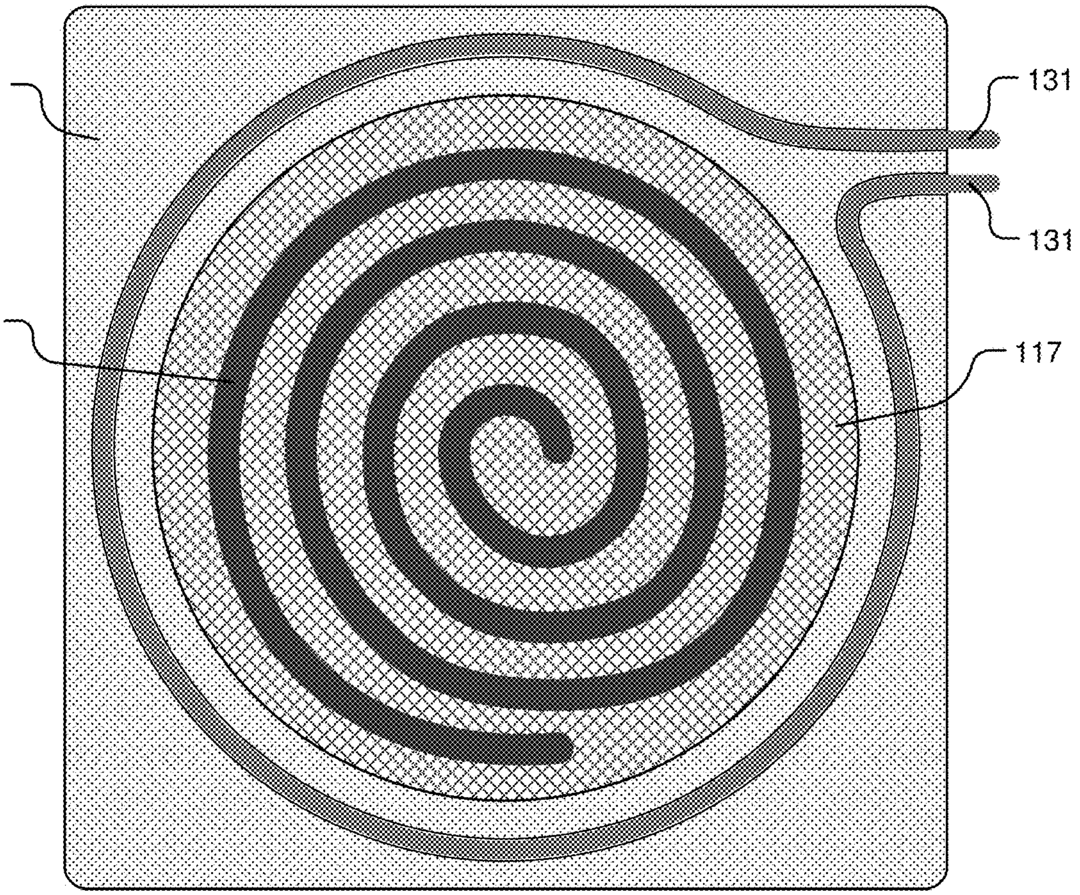
FIG. 1B shows a top view of the substrate plasma processing system, in accordance with some embodiments.

FIG. 1A shows a vertical cross-section view through a portion of an example substrate plasma processing system 100, in accordance with some embodiments. FIG. 1B shows a top view of the substrate plasma processing system 100, in accordance with some embodiments. The substrate plasma processing system 100 includes a chamber 101 that encloses a plasma processing region 103. A substrate support structure 105 is disposed within the chamber 101 in exposure to the plasma processing region 103. The substrate support structure 105 is configured to support a substrate 107 during processing of the substrate 107 by a plasma 109 generated above the substrate support structure 105. In some embodiments, the substrate support structure 105 is an electrostatic chuck configured to generate an electrostatic force that holds the substrate 107 to the substrate support structure 105.

The substrate plasma processing system 100 also includes an adapter structure 111 at the top of the chamber 101. In some embodiments, the adapter structure 111 is removable from the chamber 101, with one or more seals 113 disposed between the adapter structure 111 and the chamber 101. In some embodiments, the one of more seals 113 are configured to provide a vacuum-tight seal between the adapter structure 111 and the chamber 101. In some other embodiments, the adapter structure 111 is integrally formed as part of the chamber 101, such that the one or more seals 113 are not required to maintain vacuum integrity of the plasma processing region 103. The adapter structure 111 is configured to circumscribe an opening 112. The adapter structure 111 has a flange portion 111F that circumscribes the opening 112 and projects into the opening 112. The adapter structure 111 is configured to support a window support frame 115 on the flange portion 111F. The window support frame 115 is configured to support a window 117. In some embodiments, the window 117 is configured as a ceramic structure. In some embodiments, the window 117 is configured as a substantially disc-shaped ceramic structure. In some embodiments, the window 117 is configured as a ceramic showerhead structure that includes an arrangement of interior gas flow channels configured to receive process gas supplied from a process gas source outside of the chamber 101 and dispense the process gas into the plasma processing region 103, as indicated by arrows 119. The window 117 is substantially transparent to RF power, such that RF power emanating from a coil (or antenna 121) disposed above the window 117 is able to travel through the window 117 and into the plasma processing region 103. It should be understood that in various embodiments the window 117 can be formed of essentially any material, e.g., ceramic, quartz, etc., that is substantially transparent to RF power and that is chemically, mechanically, and thermally compatible with the conditions to which the window 117 is exposed within the plasma processing region 103.

The coil (or antenna) 121 is disposed above the window 117 to transmit RF power through the window 117 into the plasma processing region 103. In some embodiments, the coil 121 has a planar-spiral shape (see FIG. 1B). For example, in the cross-section of FIG. 1A, coil portions 121A extend out of the page and coil portions 121B extend into the page. It should be understood that in various embodiments the coil 121 can have essentially any configuration so long as the coil 121 is configured to transmit RF power through the window 117 into the plasma processing region 103. In some embodiments, the coil 121 is electrically connected to receive RF power from an RF power supply 123 by way of an impedance matching network 125, as indicated by the electrical connection 127. In some embodiments, the impedance matching network 125 is a network of capacitors and/or inductors configured to minimize reflection of RF power from the coil 121, so that RF power transfer to the plasma 109 load is optimized.

The RF power that is transmitted from the coil 121 into the plasma processing region 103 transforms the process gas/mixture into the plasma 109 within the plasma processing region 103. The plasma 109 is generated to cause a change to the substrate 107 in a controlled manner. In various fabrication processes, the change to the substrate 107 can be a change in material or surface condition on the substrate 107. For example, in various fabrication processes, the change to the substrate 107 can include one or more of etching of a material from the substrate 107, deposition of a material on the substrate 107, and/or modification of material present on the substrate 107. The used process gas/mixture and process byproduct materials are exhausted from the plasma processing region 103, as indicated by arrows 129. It should be understood that the plasma processing system 100 can be any type of plasma processing system in which RF power is transmitted to the process gas/mixture within the plasma processing region 103 to generate the plasma 109 over the substrate 107 supported on the substrate support structure 105.

In some embodiments, the substrate 107 is a semiconductor wafer undergoing a fabrication procedure. However, it should be understood that in various embodiments, the substrate 107 can be essentially any type of substrate that is subjected to a plasma-based fabrication process. For example, in some embodiments, the substrate 107 is formed of silicon, sapphire, GaN, GaAs or SiC, and/or other substrate materials, and can include glass panels/substrates, metal foils, metal sheets, polymer materials, or the like. Also, in various embodiments, the substrate 107 may vary in form, shape, and/or size. For example, in some embodiments, the substrate 107 is a semiconductor wafer with an outer diameter of 200 mm, 300 mm, 450 mm, or another size. Also, in some embodiments, the substrate 107 is a non-circular substrate, such as a rectangular substrate for a flat panel display, or the like, among other shapes.

The top view of the substrate plasma processing system 100 as shown in FIG. 1B shows a cooling device 131 disposed within the adapter structure 111. In some embodiments, the adapter structure 111 is formed of a high thermal conductivity material, such as aluminum or other similar thermally conductive material, that has sufficient mechanical strength to support the window 117 and that is chemically compatible with the plasma process performed within the plasma processing region 103. In some embodiments, the cooling device 131 is disposed within a groove or channel 133 formed within the adapter structure 111. In some embodiments, the groove/channel 133 is milled/machined/cast into a top surface of the adapter structure 111. However, it should be understood that in other embodiments, the cooling device 131 can be embedded within the adapter structure 111 in different ways, such as through a slot formed in the outer surface of the adapter structure 111. The groove/channel 133 and the cooling device 131 are configured to substantially circumscribe the window 117. The cooling device 131 is in thermal contact with the adapter structure 111 to provide for conductive heat transfer from the adapter structure 111 to the cooling device 131. In some embodiments, the cooling device 131 is configured as a tube formed of thermally conductive material, e.g., aluminum, copper, or other similar material, through which a cooling fluid is flowed. In some embodiments, the cooling fluid is water. However, in other embodiments, the cooling fluid can be essentially any flowable fluid that has heat transfer characteristics suited for removal of heat from the adapter structure 111 and conveyance of the removed heat to an external heat sink. In some embodiments, rather than having the separate cooling device 131 disposed with the adapter structure 111, the adapter structure 111 itself is formed to have an interior flow channel through which the cooling fluid can be flowed to remove heat from the adapter structure 111. In some embodiments, the interior flow channel is configured to substantially circumscribe the window 117, such that heat is removed from the adapter structure 111 by the cooling fluid in a substantially uniform manner around the outer periphery of the window 117.

Figure 2A:
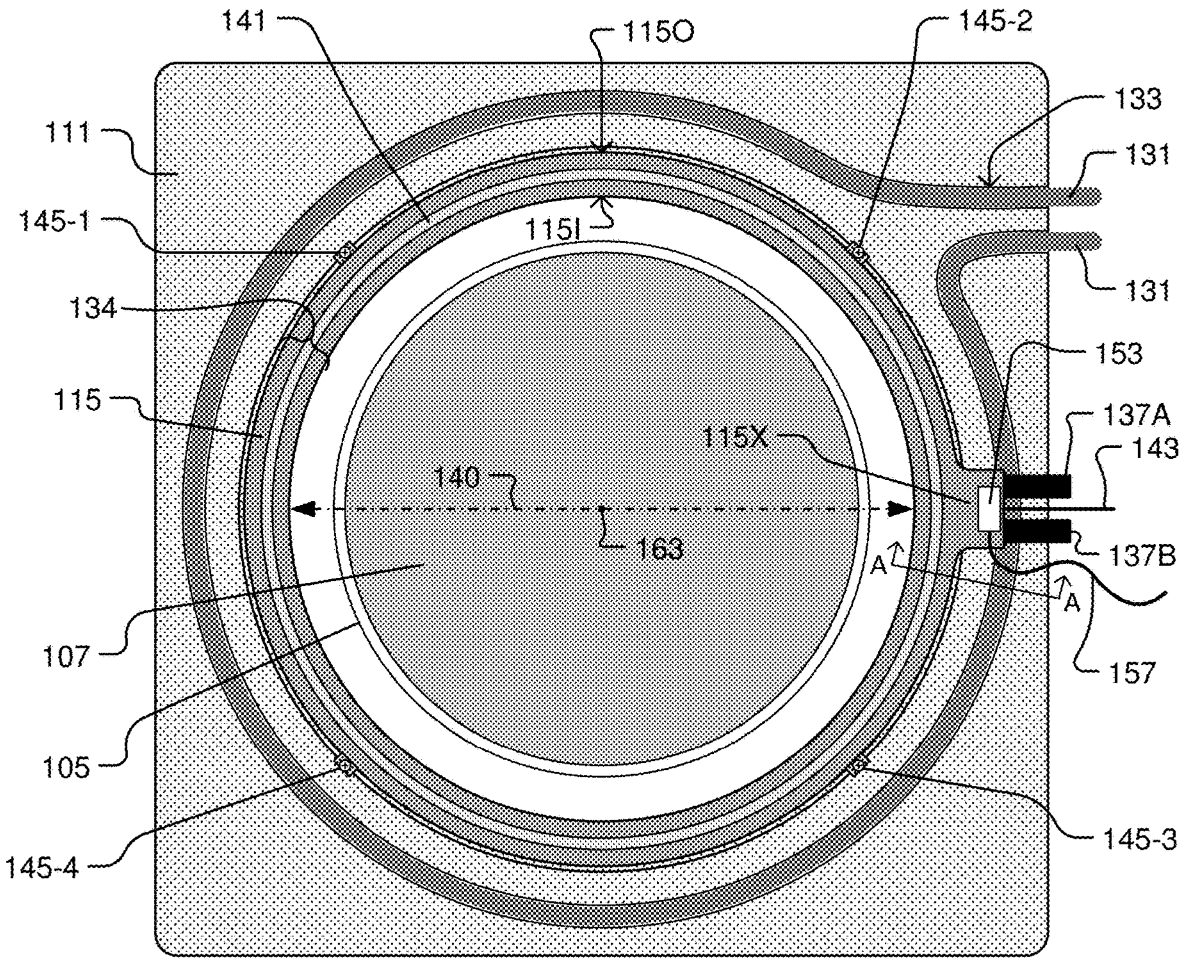
FIG. 2A shows a top view of the substrate plasma processing system with the coil and the window removed, in accordance with some embodiments.
Figure 2B:
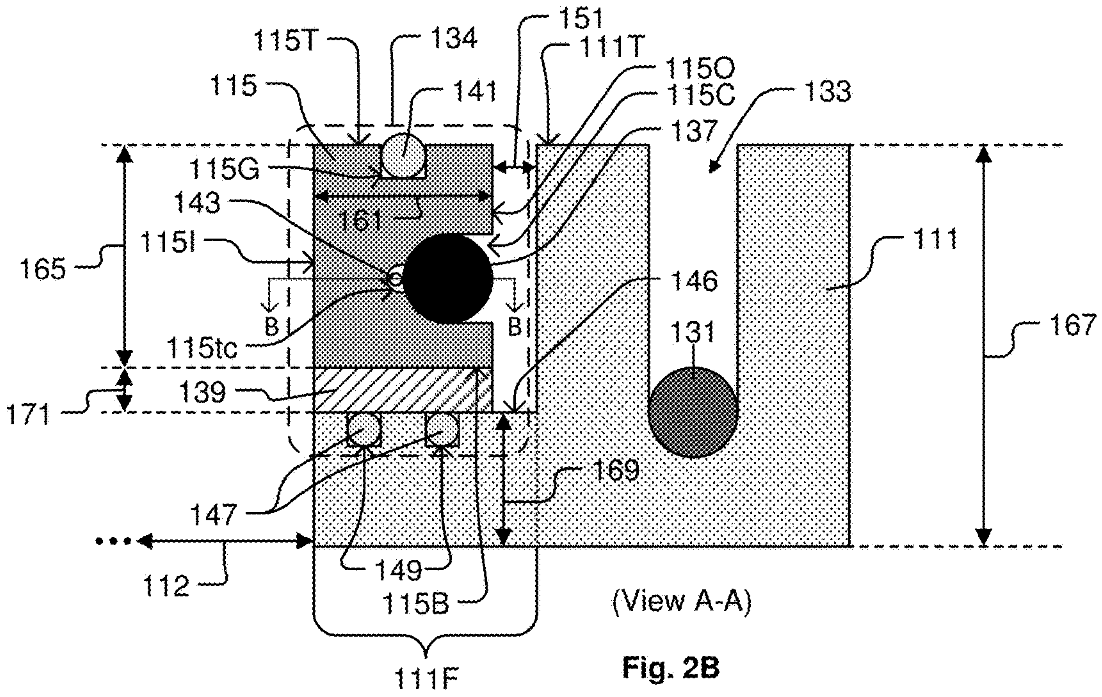
FIG. 2B shows a vertical cross-section through the window support system, referenced as View A-A in FIG. 2A, in accordance with some embodiments.

FIG. 2A shows a top view of the substrate plasma processing system 100 with the coil 121 and the window 117 removed, in accordance with some embodiments. The substrate plasma processing system 100 includes a window support system 134 for the plasma processing chamber 101. The window support system 134 includes the window support frame 115, a heating element 137 disposed around the window support frame 115, and a thermal insulator member 139 disposed between the window support frame 115 and the adapter structure 111. The window support frame 115 is configured to circumscribe an opening 140. FIG. 2B shows a vertical cross-section through the window support system 134, referenced as View A-A in FIG. 2A, in accordance with some embodiments. The window support frame 115 has a top surface 115T, a bottom surface 115B, an inner surface 115I, and an outer surface 115O. Each of the inner surface 115I and outer surface 115O extends between the top surface 115T and the bottom surface 115B. The top surface 115T of the window support frame 115 is configured to mechanically and thermally interface with an outer peripheral portion (edge region) of the window 117. The window 117 is disposed on the window support frame 115 such that a circuitous outer peripheral portion of the window 117 is in thermal contact with the window support frame 115.

In some embodiments, a vacuum-tight seal is established between the window 117 and the top surface 115T of the window support frame 115. In some embodiments, the top surface 115T of the window support frame 115 includes a groove 115G configured to receive a seal member 141 for establishing the vacuum-tight seal between the window support frame 115 and the window 117. It should be understood that in various embodiments, different sealing mechanisms can be used to establish the vacuum-tight seal between the window support frame 115 and the window 117, so long as the window 117 is in conductive heat transfer with the window support frame 115.

In some embodiments, a shape of the window support frame 115 is configured to substantially match a shape of an outer peripheral edge region of the window 117. In some embodiments, the window support frame 115 is substantially ring-shaped, and the window 117 has a right circular cylinder shape. In these embodiments, the outer peripheral portion of the window 117 that is disposed in direct conductive heat transfer with the window support frame 115 is an outer annular-shaped portion of a bottom surface 117B of the window 117. In some embodiments, the window support frame 115 is secured to the adapter structure 111. For example, FIG. 2A shows the window support frame 115 secured to the adapter structure 111 by a number of fasteners 145-1 through 145-4. In some embodiments, a vacuum pressure generated within the plasma processing region 103 is sufficient to hold the window support frame 115 to the adapter structure 111, such that fasteners, e.g., 145-1 through 145-4, are not used.

The window support frame 115 has a radial thickness 161 (see FIG. 2B) as measured between the inner surface 115I and the outer surface 115O of the window support frame 115, where the radial thickness 161 is measured along a line that extends through a center point 163 (see FIG. 2A) of the opening 140 circumscribed by the window support frame 115. In some embodiments, the radial thickness 161 of the window support frame 115 is sized as small as possible while ensuring that the window support frame 115 is able to support the window 117, and while providing an adequate amount of surface contact area between the window support frame 115 and the window 117 for heat transfer from the heating element 137 to the window 117 by way of the window support frame 115 in order to achieve and maintain a setpoint temperature along the outer peripheral edge region of the window 117.

In some embodiments, the window support frame 115 has a vertical height 165 defined to provide for substantial co-planar alignment between the top surface 115T of the window support frame 115 and a top surface 111T of the adapter structure 111 when the window support frame 115 is disposed on top of the thermal insulator member 139, with the thermal insulator member 139 disposed on the flange portion 111F of the adapter structure 111. Therefore, in these embodiments, the vertical height 165 of the window support frame 115 is less than a vertical height 167 of the adapter structure 111. In these embodiments, a vertical height 169 of the flange portion 111F of the adapter structure 111 is defined so that that a sum of the vertical height 169 of the flange portion 111F and a vertical height 171 of the thermal insulator material 139 and the vertical height 165 of the window support frame 115 is substantially equal to the vertical height 167 of the adapter structure 111. It should be understood, however, that in some other embodiments, the vertical height 165 of the window support frame 115 is defined so that the top surface 115T of window support frame 115 is either above or below the top surface 111T of the adapter structure 111.

Figure 2C:
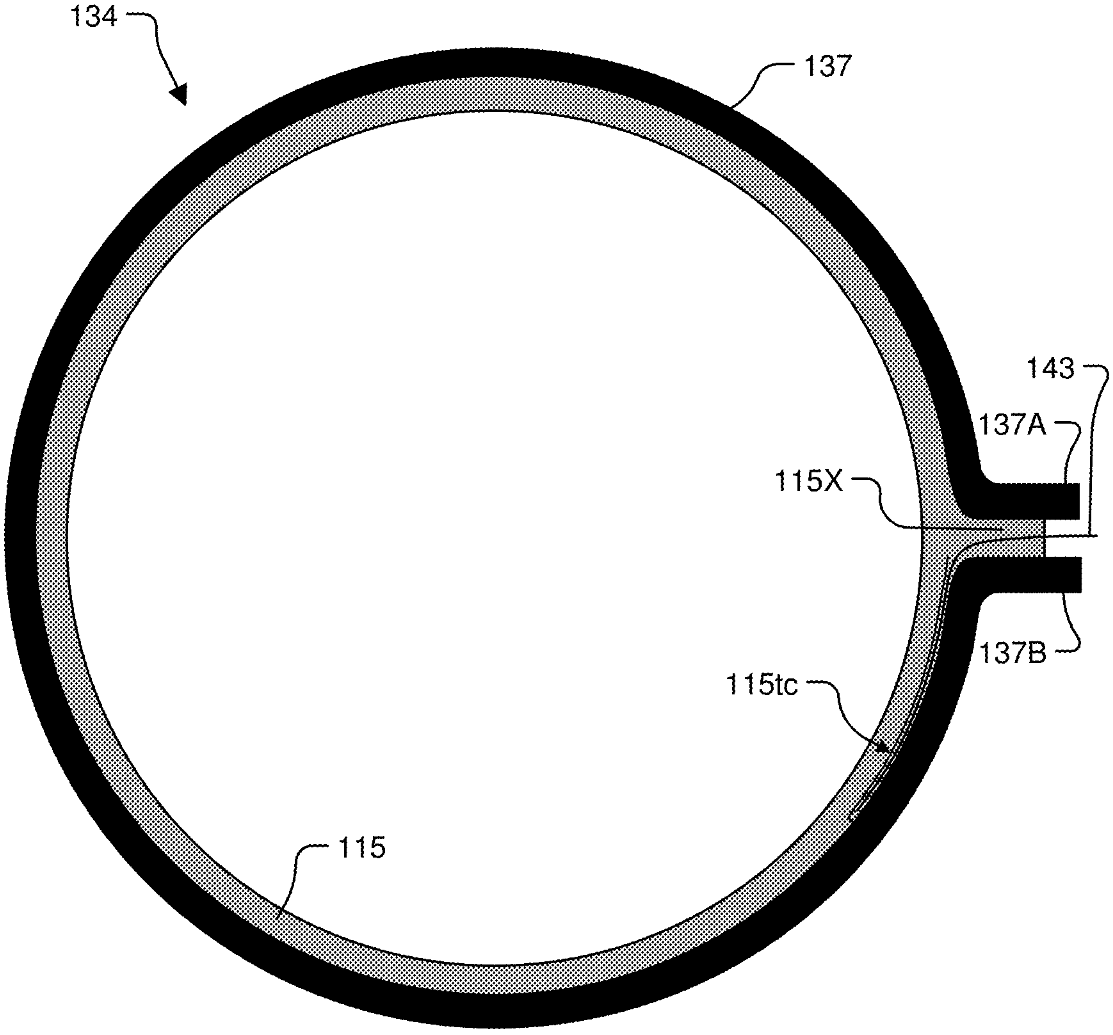
FIG. 2C shows a horizontal cross-section view through the window support system, referenced as View B-B in FIG. 2B, in accordance with some embodiments.

FIG. 2C shows a horizontal cross-section view through the window support system 134, referenced as View B-B in FIG. 2B, in accordance with some embodiments. In some embodiments, a channel 115C is formed within the outer surface 115O of the window support frame 115. The channel 115C is configured to receive the heating element 137. The heating element 137 is disposed within the channel 115C. The heating element 137 is configured to substantially circumscribe the window support frame 115. In some embodiments, the heating element 137 is secured within the channel 115C by a spring force imparted from the heating element 137 to the window support frame 115. In some embodiments, the heating element 137 is secured within the channel 115C by potting, brazing, or essentially any other type of process or connection technique that provides for establishing a secure mechanical and thermal connection between the heating element 137 and the window support frame 115. The heating element 137 is in direct conductive heat transfer with the window support frame 115. In some embodiments, the heating element 137 is an electrical resistance heating element. In some embodiments, the channel 115C has a cross-sectional shape that substantially matches the cross-sectional shape of the heating element 137. In some embodiments, the heating element has a substantially circular cross-sectional shape. In some embodiments, the heating element 137 is capable of raising a temperature of a peripheral portion of the window 117 to at least 150° Celsius by way of heat transfer through the window support frame 115 to the window 117.

In some embodiments, a thermocouple insertion channel 115*tc* is formed along a portion of the channel 115C. In some embodiments, a thermocouple device 143 is inserted into the thermocouple insertion channel 115*tc*. In this manner, in some embodiments, the thermocouple device 143 is disposed between the heating element 137 and the window support frame 115. In some embodiments, the thermocouple insertion channel 115*tc* extends over less than one-quarter of the circumferential distance around the window support frame 115. In some embodiments, the thermocouple insertion channel 115*tc* extends over less than one-eighth of the circumferential distance around the window support frame 115. In some embodiments, the thermocouple insertion channel 115*tc* extends just far enough along the channel 115C of the window support frame 115 to allow the thermocouple device 143 to be positioned between a heating portion of the heating element 137 and the window support frame 115. In some embodiments, as an alternative to the thermocouple device 143 or in addition to the thermocouple device 143, the heating element 137 itself is configured to include one or more embedded thermocouple device(s) having corresponding electrical connectors extending out of the heating element 137 and out of the window support frame 115. Also, in some embodiments, multiple thermocouple devices are disposed around the channel 115C of the window support frame 115 between the heating element 137 and the window support frame 115. In some embodiments, four or more thermocouple devices are disposed around the channel 115C of the window support frame 115. In some embodiments, the multiple thermocouple devices are substantially equally spaced around the opening 140 circumscribed by the window support frame 115. In these embodiments, each of the multiple thermocouple devices has a respective electrical connection extending out of the window support frame 115.

It should be understood that the window support frame 115 is configured to provide for heat transfer between the heating element 137 and the outer peripheral portion (edge region) of the window 117. In some embodiments, the heating element 137 is configured to substantially circumscribe the window support frame 115, and correspondingly substantially circumscribe the window 117 disposed on the window support frame 115, such that heat is transferred from the heating element 137 to the window 117 in a substantially uniform manner along the outer periphery of the window 117. In some embodiments, the window support frame 115 is formed of a material having a high thermal conductivity, e.g., on the order of aluminum or higher, that is chemically compatible with the plasma process performed within the plasma processing region 103. In some embodiments, the window support frame 115 is formed of a material having a thermal conductivity of at least 200 Watts per meter-Kelvin. In some embodiments, the window support frame 115 is formed of aluminum. In some embodiments, the window support frame 115 is formed of copper. In some embodiments, the window support frame 115 is formed of titanium. In some embodiments, the window support frame 115 is formed of an aluminum alloy, a copper alloy, a titanium alloy, or another material having a thermal conductivity similar to that of aluminum or copper or titanium.

Figure 3:
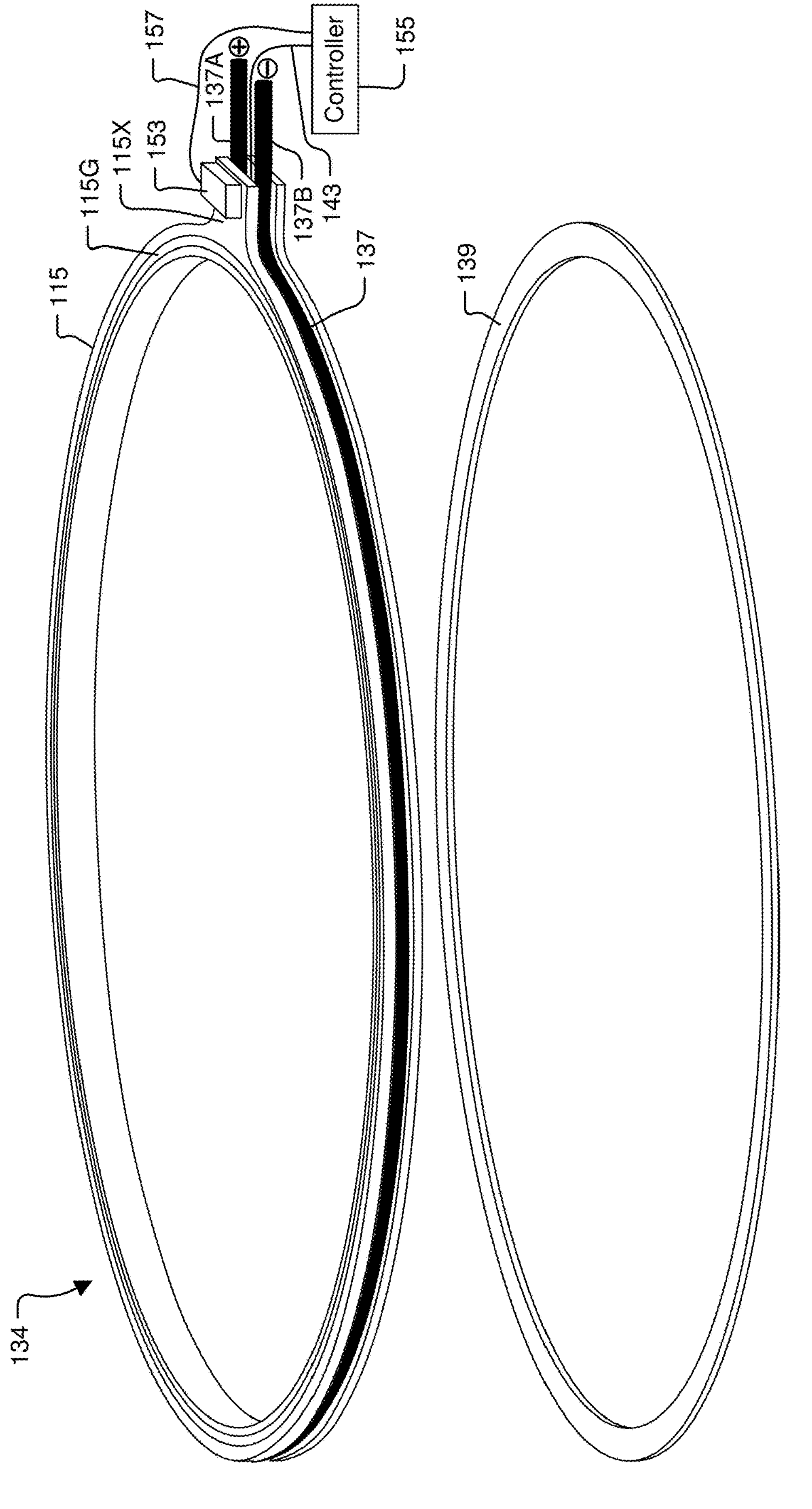
FIG. 3 shows a vertically exploded perspective view of the window support system, in accordance with some embodiments.

FIG. 3 shows a vertically exploded perspective view of the window support system 134, in accordance with some embodiments. In some embodiments, the thermal insulator member 139 is formed as a continuous circuitous structure. In some embodiments, the thermal insulator member 139 is disposed on a top surface 146 of the flange portion 111F of the adapter structure 111. The thermal insulator member 139 is configured to thermally separate the bottom surface 115B of the window support frame 115 from the adapter structure 111 (or from an upper structure of the chamber 101 in some embodiments where the upper structure is equivalent to the adapter structure 111 but formed integrally with the chamber 101). In some embodiments, the thermal insulator member 139 is formed of a material that provides for establishment of a vacuum-tight seal between the thermal insulator member 139 and the window support frame 115, and that provides for establishment of a vacuum-tight seal between the thermal insulator member 139 and the adapter structure 111 (or the upper structure of the chamber 101). In some embodiments, one or more seal members 147 are disposed between the thermal insulator member 139 and the adapter structure 111 (or upper structure of the chamber 101) to facilitate establishment of the vacuum-tight seal between the thermal insulator member 139 and the adapter structure 111 (or the upper structure of the chamber 101). Also, in some embodiments, the adapter structure 111 (or the upper structure of the chamber 101) includes respective grooves 149 for receiving the seal members 147.

In various embodiments, the thermal insulator member 139 is formed of a thermal insulator material that provides sufficient mechanical strength for supporting the window support frame 115 and window 117, that is chemically compatible with materials present in the plasma processing region 103, and that is thermally compatible with the temperature of the window support frame 115 generated by the heating element 137. In some embodiments, the thermal insulator member 139 is formed of a plastic material. In some embodiments, the thermal insulator member 139 is formed of a ceramic material. In some embodiments, the thermal insulator member 139 is formed of a stainless steel material. In some embodiments, the thermal insulator member 139 is formed of polyetheretherketone (PEEK). For electrical efficiency and performance of the window support system 134, and for thermal efficiency and performance of the window support system 134, it is preferred that as much of the thermal output from the heating element 137 as possible be transferred through the window support frame 115 to the window 117. Therefore, in some embodiments, the window support frame 115 is sized and positioned to have essentially no direct conductive heat transfer to the adapter structure 111 (or the upper structure of the chamber 101). FIG. 2B shows an example embodiment in which a gap 151 exists between the outer surface 115O of the window support frame 115 and the adapter structure 111, when the window support frame 115 and the thermal insulator member 139 are collectively disposed on the top surface 146 of the flange portion 111F of the adapter structure 111. The gap 151 extends around an entirety of the outer surface 115O of the window support frame 115, such that there is no direct thermal conduction between the outer surface 115O of the window support frame 115 and the adapter structure 111. In some embodiments, the gap 151 is an air gap. In some embodiments, a thermal insulator material is disposed in at least a portion of the gap 151. In some embodiments, the thermal insulator material disposed in the gap 151 is the same material of which the thermal insulator member 139 is formed. In some embodiments, the thermal insulator material disposed in the gap 151 is integrally formed with the thermal insulator member 139. In some embodiments, a thermal reflector is disposed in at least a portion of the gap 151, where the thermal reflector is configured to reflect heat emanating from the heating element 137 back into the window support frame 115. In some embodiments, the thermal reflector disposed in the gap 151 is integrally formed with the thermal insulator member 139.

In some embodiments, the inner surface 115I of the window support frame 115 is coated with a protective coating. In some embodiments, the protective coating on the window support frame 115 is a plasma-resistant coating. In some embodiments, the protective coating on the window support frame 115 is one or more of an anodization coating, a ceramic coating, and a yttrium-based coating. In other embodiments, the protective coating on the inner surface 115I of the window support frame 115 can be essentially any type of plasma-resistant coating used in the semiconductor fabrication industry. Also, in some embodiments, the surfaces of the adapter structure 111 that are exposed to the plasma processing region 103 are coated with a protective coating. In some embodiments, the protective coating on the adapter structure 111 is a plasma-resistant coating. In some embodiments, the protective coating on the adapter structure 111 is one or more of an anodization coating, a ceramic coating, and a yttrium-based coating. In other embodiments, the protective coating on the adapter structure 111 is essentially any type of plasma-resistant coating used in the semiconductor fabrication industry. In some embodiments, the protective coating on the adapter structure 111 is the same as the protective coating on the window support frame 115.

As shown in FIGS. 2A and 3, a temperature measurement device 153 is disposed on a connection block 115X of the window support frame 115. The connection block 115X is configured to support a first lead end 137A and a second lead end 137B of the heating element 137. In some embodiments, the temperature measurement device 153 is electrically connected to a controller 155 by way of an electrical connection 157. In this manner, the controller 155 receives a signal from the temperature measurement device 153 indicating a measured temperature of the connection block 115X. In some embodiments, the temperature measurement device 153 is used to monitor for an overheating condition that would trigger disconnection of the heating element 137 from its power supply by the controller 155. In some embodiments, the connection block 115X is configured to include a passageway for insertion of the thermocouple device 143 into the thermocouple insertion channel 115*tc*, such that the thermocouple device 143 can be inserted and removed from the thermocouple insertion channel 115*tc* when the heating element 137 is secured within the channel 115C of the window support frame 115. In some embodiments, the first lead end 137A and the second lead end 137B of the heating element 137 are electrically connected to an electrical power supply. The controller 155 is configured and programmed to control a supply of electrical power to the heating element 137, which in turn provides for control of a temperature of the window support frame 115, which in turn provides for control of a temperature of an outer peripheral edge region of the window 117. In some embodiments, the temperature measurement made by the thermocouple device 143 is used to control the heating element 137. For example, in some embodiments, the controller 155 is configured to implement a PID (proportional integral derivative) control system that uses the thermocouple device 143 temperature measurement to actively control the heating element 137 to achieve and maintain a setpoint operating temperature on the outer peripheral edge region of the window 117. In some embodiments, the setpoint operating temperature for the outer peripheral edge region of the window 117 is programmed in the controller 155. In some embodiments, the setpoint operating temperature on the outer peripheral edge region of the window 117 is about 150° Celsius. In some embodiments, the setpoint operating temperature on the outer peripheral edge region of the window 117 is greater than about 150° Celsius. The heating element 137 has an operable power range that enables the setpoint operating temperature to be achieved and maintained along the outer peripheral edge region of the window 117. In some embodiments, the heating element 137 output power is about 3 kiloWatts. However, it should be understood that in various other embodiments the heating element 137 output power is either less than or greater than 3 kilo Watts.

Figure 4:
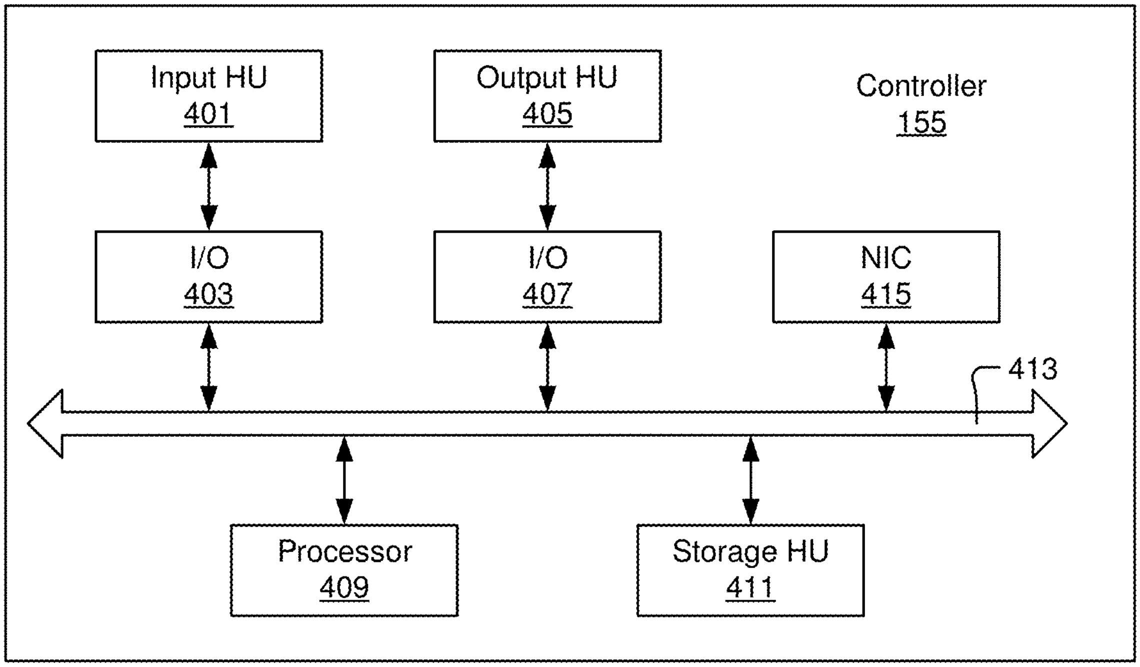
FIG. 4 shows an example diagram of the controller, in accordance with some embodiments.

FIG. 4 shows an example diagram of the controller 155, in accordance with some embodiments. In some embodiments, the controller 155 includes a processor 409, a storage hardware unit (HU) 411 (e.g., memory), an input HU 401, an output HU 405, an input/output (I/O) interface 403, an I/O interface 407, a network interface controller (NIC) 415, and a data communication bus 413. The processor 409, the storage HU 411, the input HU 401, the output HU 405, the I/O interface 403, the I/O interface 407, and the NIC 415 are in data communication with each other by way of the data communication bus 413. Examples of the input HU 401 include a mouse, a keyboard, a stylus, a data acquisition system, a data acquisition card, etc. Examples of the output HU 405 include a display, a speaker, a device controller, etc. Examples of the NIC 415 include a network interface card, a network adapter, etc. In various embodiments, the NIC 415 is configured to operate in accordance with one or more communication protocols and associated physical layers, such as Ethernet and/or EtherCAT, among others. Each of the I/O interfaces 403 and 407 is defined to provide compatibility between different hardware units coupled to the I/O interface. For example, the I/O interface 403 can be defined to convert a signal received from the input HU 401 into a form, amplitude, and/or speed compatible with the data communication bus 413. Also, the I/O interface 407 can be defined to convert a signal received from the data communication bus 413 into a form, amplitude, and/or speed compatible with the output HU 405. Although various operations described herein are performed by the processor 409 of the controller 155, it should be understood that in some embodiments various operations can be performed by multiple processors of the controller 155 and/or by multiple processors of multiple computing systems connected to the controller 155.

In various embodiments, the substrate plasma processing system 100 is integrated with electronics for controlling its operation before, during, and after processing of the substrate 107, where the electronics are implemented within the controller 155 that is configured and connected to control various components and/or sub-parts of the substrate plasma processing system 100, including the window support system 134. Depending on substrate 107 processing requirements and/or the particular configuration of the substrate plasma processing system 100, the controller 155 is programmed to control any process and/or component disclosed herein, including delivery of process gas(es), temperature settings (e.g., heating and/or cooling), pressure settings, vacuum settings, power settings, RF power supply system settings, electrical signal frequency settings, gas flow rate settings, fluid delivery settings, positional and operation settings, bias voltage supply system settings, substrate 107 transfers into and out of the chamber 101 and/or into and out of load locks connected to or interfaced with the substrate plasma processing system 100, among others.

In various embodiments, the controller 155 is defined as electronics having various integrated circuits, logic, memory, and/or software that direct and control various tasks/operations, such as receiving instructions, issuing instructions, controlling device operations, enabling cleaning operations, enabling endpoint measurements, enabling metrology measurements (optical, thermal, electrical, etc.), among other tasks/operations. In some embodiments, the integrated circuits within the controller 155 include one or more of firmware that stores program instructions, a digital signal processor (DSP), an Application Specific Integrated Circuit (ASIC) chip, a programmable logic device (PLD), one or more microprocessors, and/or one or more microcontrollers that execute program instructions (e.g., software), among other computing devices. In some embodiments, the program instructions are communicated to the controller 155 in the form of various individual settings (or program files), defining operational parameters for carrying out a process on the substrate 107 within the substrate plasma processing system 100. In some embodiments, the operational parameters are included in a recipe defined by process engineers to accomplish one or more processing steps during the fabrication of one or more layers, materials, metals, oxides, silicon, silicon dioxide, surfaces, circuits, and/or dies on the substrate 107.

In some embodiments, the controller 155 is a part of, or connected to, a computer that is integrated with, or connected to, the substrate plasma processing system 100, or that is otherwise networked to the substrate plasma processing system 100, or a combination thereof. For example, in some embodiments, the controller 155 is implemented in a "cloud" or all or a part of a fab host computer system, which allows for remote access for control of substrate 107 processing by the substrate plasma processing system 100. The controller 155 enables remote access to the substrate plasma processing system 100 to provide for monitoring of current progress of fabrication operations, provide for examination of a history of past fabrication operations, provide for examination of trends or performance metrics from a plurality of fabrication operations, provide for changing of processing parameters, provide for setting of subsequent processing steps, provide for specification of RF power supply system operational parameters, provide for specification of bias voltage supply system operational parameters, provide for specification of window support system 134 operational parameters, and/or provide for initiation of a new substrate fabrication process.

In some embodiments, a remote computer, such as a server computer system, provides process recipes to the controller 155 over a computer network, which includes a local network and/or the Internet. The remote computer includes a user interface that enables entry or programming of parameters and/or settings, which are then communicated to the controller 155 from the remote computer. In some examples, the controller 155 receives instructions in the form of settings for processing the substrate 107 within the substrate plasma processing system 100. It should be understood that the settings are specific to a type of process to be performed on the substrate 107 and a type of tool/device/component that the controller 155 interfaces with or controls. In some embodiments, the controller 155 is distributed, such as by including one or more discrete controller(s) 155 that are networked together and synchronized to work toward a common purpose, such as operating the substrate plasma processing system 100 to perform a prescribed process on the substrate 107. An example of a distributed controller 155 for such purposes includes one or more integrated circuits on a chamber in communication with one or more integrated circuits located remotely (such as at a platform level or as part of a remote computer) that combine to control a process in the chamber 101.

Figure 5:
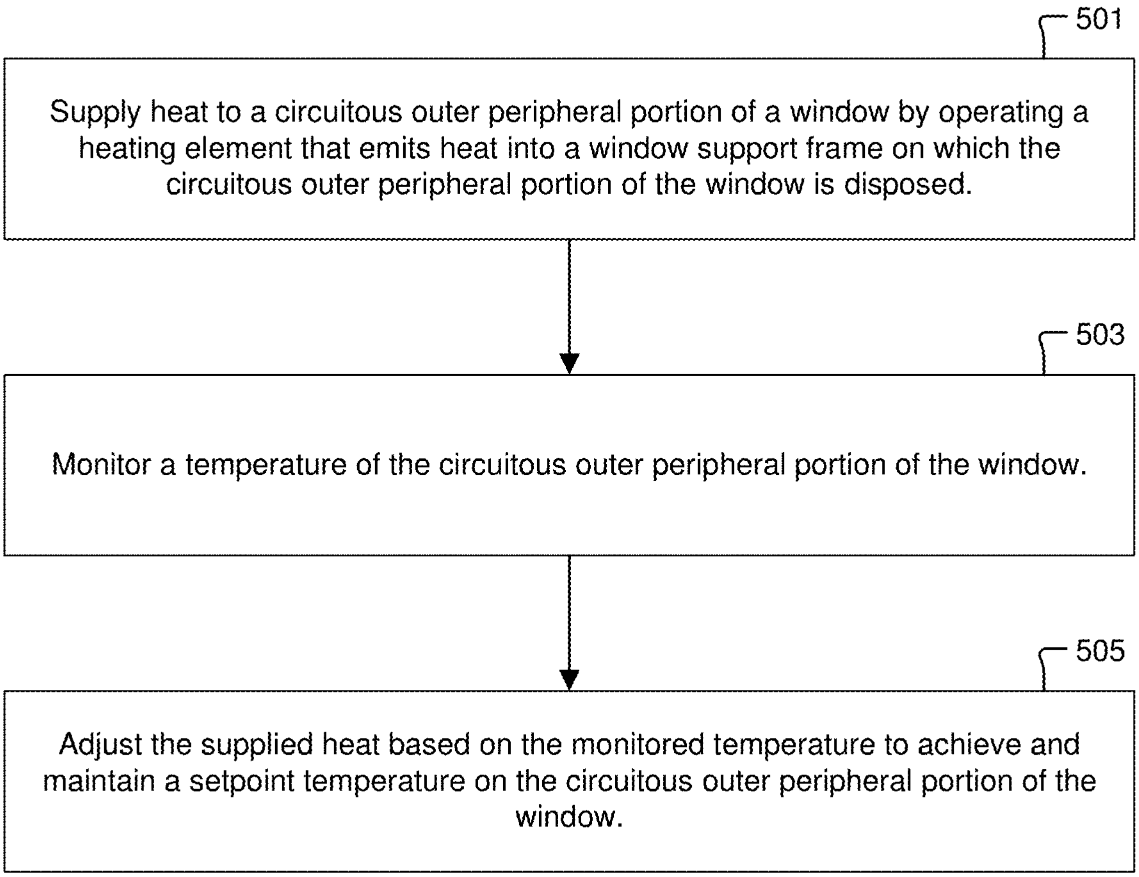
FIG. 5 shows a flowchart of a method for controlling temperature of the window of the plasma processing chamber, in accordance with some embodiments.

FIG. 5 shows a flowchart of a method for controlling temperature of the window 117 of the plasma processing chamber 101, in accordance with some embodiments. The method includes an operation 501 for supplying heat to a circuitous outer peripheral portion of the window 117 by operating the heating element 137 that emits heat into the window support frame 115 on which the circuitous outer peripheral portion of the window 117 is disposed. In some embodiments, the window 117 is disposed in thermally conductive contact with the top surface 115T of the window support frame 115, where the window support frame 115 is configured to circumscribe the opening 140. The window support frame 115 has the inner surface 115I and the outer surface 115O. Each of the inner surface 115I and the outer surface 115O extends between the top surface 115T and the bottom surface 115B of the window support frame 115. The window support frame 115 also includes the channel 115C formed within the outer surface 115O. The heating element 137 is disposed within the channel 115C. The heating element 137 is configured to substantially circumscribe the window support frame 115. The window 117 is substantially transparent to RF power. The method also includes an operation 503 for monitoring a temperature of the circuitous outer peripheral portion of the window 117. The method also includes an operation 505 for adjusting the heat supplied in the operation 501 based on the temperature monitored in the operation 503 to achieve and maintain a setpoint temperature on the circuitous outer peripheral portion of the window 117. In some embodiments, the operation 503 monitors the temperature against a threshold value. If the detected temperature exceeds the threshold value, the controller 155 will automatically stop (or pause) supplying heat to the circuitous outer peripheral portion of the window 117. This will prevent accidentally overheating the window. In some embodiments, the heating element 137 is operated to increase a temperature of the window support frame 115 and correspondingly increase a temperature of an outer peripheral region of the window 117 to a setpoint temperature greater than or equal to about 150° Celsius. In some embodiments, the method also includes directing a flow of a cooling gas, e.g., air, onto a central region of a top surface of the window 117, such as indicated by arrow 159 in FIG. 1A, to further reduce the center-to-edge radial temperature gradient across the window 117.

In some embodiments, the method includes disposing the thermal insulator member 139 between the window support frame 115 and the adapter structure 111. In these embodiments, the adapter structure 111 is configured to support the thermal insulator member 139 and the window support frame 115. The adapter structure 111 is also configured to extend around the outer surface 115O of the window support frame 115 without obscuring the opening 140 circumscribed by the window support frame 115 and without contacting the window support frame 115. In some embodiments, the method also includes flowing a cooling fluid through the cooling device 131 disposed within the adapter structure 111. In some embodiments, the cooling device 131 is configured to extend around the outer perimeter of the window support frame 115. In some embodiments, the cooling device 131 is a conduit through which the cooling fluid is flowed.

The window support system 134 provides for thermal decoupling of the window 117 from the heat sink of the adapter structure 111 and/or chamber 101. It should be understood that without implementation of the window support system 134, in some substrate plasma processing applications the heat sink provided by the adapter structure 111 and/or chamber 101 creates a large enough temperature gradient in the window 117 to cause thermal stress fracture of the window 117. The window support system 134 introduces a heat source at the outer peripheral edge of the window 117, which serves to mitigate heat loss from the edge of the window 117 to the adapter structure 111 and/or chamber 101 and thereby reduce the thermal gradient and correspondingly reduce the stress in the window 117. In various embodiments, the window support system 134 is configured for implementation into an existing plasma processing chamber body to preserve an extant geometric relationship between the window 117 and the plasma processing chamber body, which provides for process compatibility. Also, implementation and use of the window support system 134 avoids having to make attempts at heating the chamber body to preserve the integrity of the window 117, where heating of the chamber body causes many other problems such as complication with required powers, safety concern of having a hot chamber body (greater than 100° Celsius), and compatibility with other devices (such as manometers, valves, etc.) that are attached to the chamber.

In some embodiments, the window support system 134 provides for preservation of window 117 integrity in high-power plasma processing applications where the coil 121 power is greater than or equal to about 2 kiloWatts and the pressure within the plasma processing region 103 is greater than or equal to about 100 milliTorr. It should be appreciated that the window support system 134 provides improvement over efforts to simply thermally insulate the window 117 from the adapter structure 111 and/or chamber 101. Specifically, the window support system 134 completely eliminates the heat sink thermal influence on the window 117 caused by the adapter structure 111 and/or chamber 101 and provides a heat source at the window 117 edge. The window support system 134 is particularly helpful with maintaining the structural integrity of a larger diameter window 117 that may be used when the substrate plasma processing system 100 is configured to process larger diameter substrates 107, e.g., 300 millimeter or larger diameter substrates 107, where the larger diameter window 117 requires a lower center-to-edge temperature gradient to avoid cracking/breaking of the window 117. The heat output by the window support system 134 increases the temperature around the edge of the window 117 and correspondingly reduces the center-to-edge temperature gradient across the window 117, which allows the window 117 to survive high-power/high-pressure substrate plasma processing applications. As an additional benefit, the window support system 134 can be used to reduce or eliminate the first wafer effect.

The various embodiments described herein may be practiced in conjunction with various computer system configurations including hand-held hardware units, microprocessor systems, microprocessor-based or programmable consumer electronics, minicomputers, mainframe computers and the like. The various embodiments described herein can also be practiced in conjunction with distributed computing environments where tasks are performed by remote processing hardware units that are linked through a computer network. It should also be understood that the various embodiments disclosed herein include performance of various computer-implemented operations involving data stored in computer systems. These computer-implemented operations are those that manipulate physical quantities. In various embodiments, the computer-implemented operations are performed by either a general purpose computer or a special purpose computer. In some embodiments, the computer-implemented operations are performed by a selectively activated computer, and/or are directed by one or more computer programs stored in a computer memory or obtained over a computer network. When computer programs and/or digital data is obtained over the computer network, the digital data may be processed by other computers on the computer network, e.g., a cloud of computing resources. The computer programs and digital data are stored as computer-readable code on a non-transitory computer-readable medium. The non-transitory computer-readable medium is any data storage hardware unit, e.g., a memory device, etc., that stores data, which is thereafter readable by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), digital video/versatile disc (DVD), magnetic tapes, and other optical and non-optical data storage hardware units. In some embodiments, the computer programs and/or digital data are distributed among multiple computer-readable media located in different computer systems within a network of coupled computer systems, such that the computer programs and/or digital data is executed and/or stored in a distributed fashion.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

What is claimed is:

1. A window support system for a plasma processing chamber, comprising:

a window support frame configured to circumscribe an opening, the window support frame having a top surface, a bottom surface, an inner surface, and an outer surface, each of the inner surface and outer surface extending between the top surface and the bottom surface, wherein a channel is formed within the outer surface, the top surface configured to support and supply heat to an outer peripheral portion of a window that is substantially transparent to radiofrequency power; and a heating element disposed within the channel, the heating element configured to substantially circumscribe the window support frame, wherein the window support frame is substantially ring-shaped, the window has a right circular cylinder shape, and the outer peripheral portion of the window is an outer annular-shaped portion of a bottom surface of the window.

2. The window support system for the plasma processing chamber as recited in claim 1, further comprising:

a thermocouple insertion channel formed along a portion of the channel.

3. The window support system for the plasma processing chamber as recited in claim 2, further comprising:

a thermocouple device inserted into the thermocouple insertion channel.

4. The window support system for the plasma processing chamber as recited in claim 1, wherein the top surface of the window support frame includes a groove configured to receive a seal member for establishing a vacuum-tight seal between the window support frame and the window.

5. The window support system for the plasma processing chamber as recited in claim 1, wherein the window support frame is formed of a material having a thermal conductivity of at least 200 Watts per meter-Kelvin.

6. The window support system for the plasma processing chamber as recited in claim 1, wherein the window support frame is formed of aluminum.

7. The window support system for the plasma processing chamber as recited in claim 1, wherein the inner surface of the window support frame is coated with a plasma-resistant coating.

8. The window support system for the plasma processing chamber as recited in claim 7, wherein the plasma-resistant coating is one or more of an anodization coating, a ceramic coating, and a yttrium-based coating.

9. The window support system for the plasma processing chamber as recited in claim 1, further comprising:

a thermal insulator member configured to thermally separate the bottom surface of the window support frame from a structure of the plasma processing chamber, the thermal insulator member formed as a continuous circuitous structure.

10. The window support system for the plasma processing chamber as recited in claim 9, wherein the thermal insulator member is formed of a plastic material.

11. The window support system for the plasma processing chamber as recited in claim 1, wherein the window support frame is sized and positioned to have essentially no direct conductive heat transfer to a structure of the plasma processing chamber.

12. A plasma processing system, comprising:

a chamber having a wall that surrounds a plasma processing region;

an adapter structure configured to interface with a top of the wall of the chamber, the adapter structure configured to circumscribe a first opening, the adapter structure having a flange portion that circumscribes the first opening and projects into the first opening;

a thermal insulator member disposed on the flange portion of the adapter structure, the thermal insulator member formed as a continuous circuitous structure;

a window support frame disposed on the thermal insulator member, the window support frame configured to circumscribe a second opening, the window support frame having a top surface, a bottom surface, an inner surface, and an outer surface, each of the inner surface and outer surface extending between the top surface and the bottom surface, the window support frame including a channel formed within the outer surface;

a heating element disposed within the channel of the window support frame, the heating element configured to substantially circumscribe the window support frame; and a window disposed on the window support frame such that a circuitous outer peripheral portion of the window is in thermal contact with the window support frame, the window substantially transparent to radiofrequency power.

13. The plasma processing system as recited in claim 12, wherein the adapter structure includes a cooling device configured to extend around the first opening, the cooling device disposed in thermally conductive contact with the adapter structure.

14. The plasma processing system as recited in claim 13, wherein the cooling device is a conduit through which a cooling fluid is flowed.

15. The plasma processing system as recited in claim 14, wherein the conduit is disposed in a channel within the adapter structure.

16. The plasma processing system as recited in claim 12, wherein the first opening in the adapter structure is sized larger than the window support frame such that a gap exists between the outer surface of the window support frame and the adapter structure.

* * * * *